United States Patent [19]

Weick

[11] Patent Number: 4,791,312
[45] Date of Patent: Dec. 13, 1988

[54] PROGRAMMABLE LEVEL SHIFTING INTERFACE DEVICE

[75] Inventor: John M. Weick, Centerville, N.Y.

[73] Assignee: Grumman Aerospace Corporation, Bethpage, N.Y.

[21] Appl. No.: 59,073

[22] Filed: Jun. 8, 1987

[51] Int. Cl.$^4$ .......................... H03K 5/08; H03K 5/12
[52] U.S. Cl. .................................. 307/264; 307/262; 307/263; 307/475
[58] Field of Search .................. 307/475, 264, 200 A, 307/262, 473, 263

[56] References Cited

U.S. PATENT DOCUMENTS

| Re. 29,982 | 5/1979 | Aoki . | |
|---|---|---|---|
| 3,458,723 | 7/1969 | Hanson . | |
| 3,521,086 | 7/1970 | Slob . | |
| 3,648,071 | 3/1972 | Mrazek . | |
| 3,699,355 | 10/1972 | Madrazo et al. . | |
| 3,751,689 | 8/1973 | Hogg . | |
| 3,758,868 | 9/1973 | Brown . | |
| 3,781,689 | 12/1973 | Marshall et al. . | |
| 3,832,535 | 8/1974 | De Vito . | |
| 3,952,212 | 4/1976 | Matsumoto et al. . | |
| 3,980,898 | 9/1976 | Priel . | |
| 3,989,992 | 11/1976 | Schmidt . | |
| 4,002,931 | 1/1977 | Tsang et al. . | |
| 4,047,055 | 9/1977 | Romano | 307/262 |
| 4,096,398 | 6/1978 | Khaitan . | |
| 4,102,491 | 7/1978 | De Vito et al. . | |
| 4,131,808 | 12/1978 | Kuo . | |
| 4,362,955 | 12/1982 | Davenport | 307/263 |
| 4,412,138 | 10/1983 | Becker | 307/264 |
| 4,454,432 | 6/1984 | Wood . | |
| 4,486,672 | 12/1984 | Nishimura et al. | 307/262 |
| 4,623,799 | 11/1986 | Nyman, Jr. | 307/264 |
| 4,672,524 | 6/1987 | Toriyama et al. | 307/263 |

OTHER PUBLICATIONS

U.S. patent application Ser. No. 59,075, filed Jun. 8, 1987, by John M. Weick.

U.S. patent application Ser. No. 24,486, filed Mar. 11, 1987, by Joseph Langone.

*Primary Examiner*—John Zazworsky
*Attorney, Agent, or Firm*—Pollock, VandeSande & Priddy

[57] ABSTRACT

A programmable logic shifting interface circuit provides programmable high and low level output signals from TTL input signals. Programmable upper and lower logic levels are available at the output so that a wide variety of different digital circuits may be tested by the invention.

2 Claims, 2 Drawing Sheets

PROGRAMMABLE LEVEL SHIFTING INTERFACE DEVICE

FIELD OF THE INVENTION

The present invention relates to digital drivers, and more particularly to such a driver capable of translating digital signals to different voltage levels in accordance with programmed reference inputs.

BACKGROUND OF THE INVENTION

Military facilities, including shipboard electronic instrumentation, require frequent testing and calibration in order to operate reliably. Efforts have been made in recent years to develop a single testing apparatus which is capable of testing a wide variety of electronic devices. The advantage of such an approach is to avoid the cost and inconvenience of having individual test equipment for electronic devices to be tested.

Generally, such test apparatus, known as automatic test equipment (ATE), will provide a parallel digital output to a device or unit undergoing test (UUT). As test data is generated by the automatic test equipment, the response of a connected UUT is detected and compared to an expected response. Failure to respond properly uncovers a fault with the UUT.

The problems with available prior art test equipment are: a relatively low operating speed and the lack of conveniently testing the capability of a UUT to operate in a tri-state condition.

BRIEF DESCRIPTION OF THE PRESENT INVENTION

The present invention offers a high-speed hybrid digital driver which interfaces TTL digital word generators (DWG) with UUT's.

The present invention provides capability of converting the DWG signals which are TTL level signals into signals whose upper and lower voltage levels are programmable. The timing is provided by the DWG. The present invention does not modify the duration of the "ONES" and "ZEROS." However, the amplitude of the ONE and likewise the amplitude of the ZERO are provided as reference voltages to the driver. Thus, the needs of a UUT for special levels of digital signals can be satisfied. In addition, the driver also provides additional driving power beyond that available from the TTL output chip in the DWG itself.

Further, the present driver includes a control input which allows the driver output to be put into a tri-state mode, independent of the state of the signal input.

Of significance is the inclusion of edge coupling circuits to quickly drive the output of the present invention to programmable reference voltages.

Short circuit protection within the circuitry of the invention is afforded for upper and lower programmable circuit sections. In the event an excessive current is detected in either of these sections, output switches are opened to prevent damage to circuit components.

Accordingly, the present high speed digital driver offers the user great versatility and enables a large variety of UUT's to be fully tested by a single ATE.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
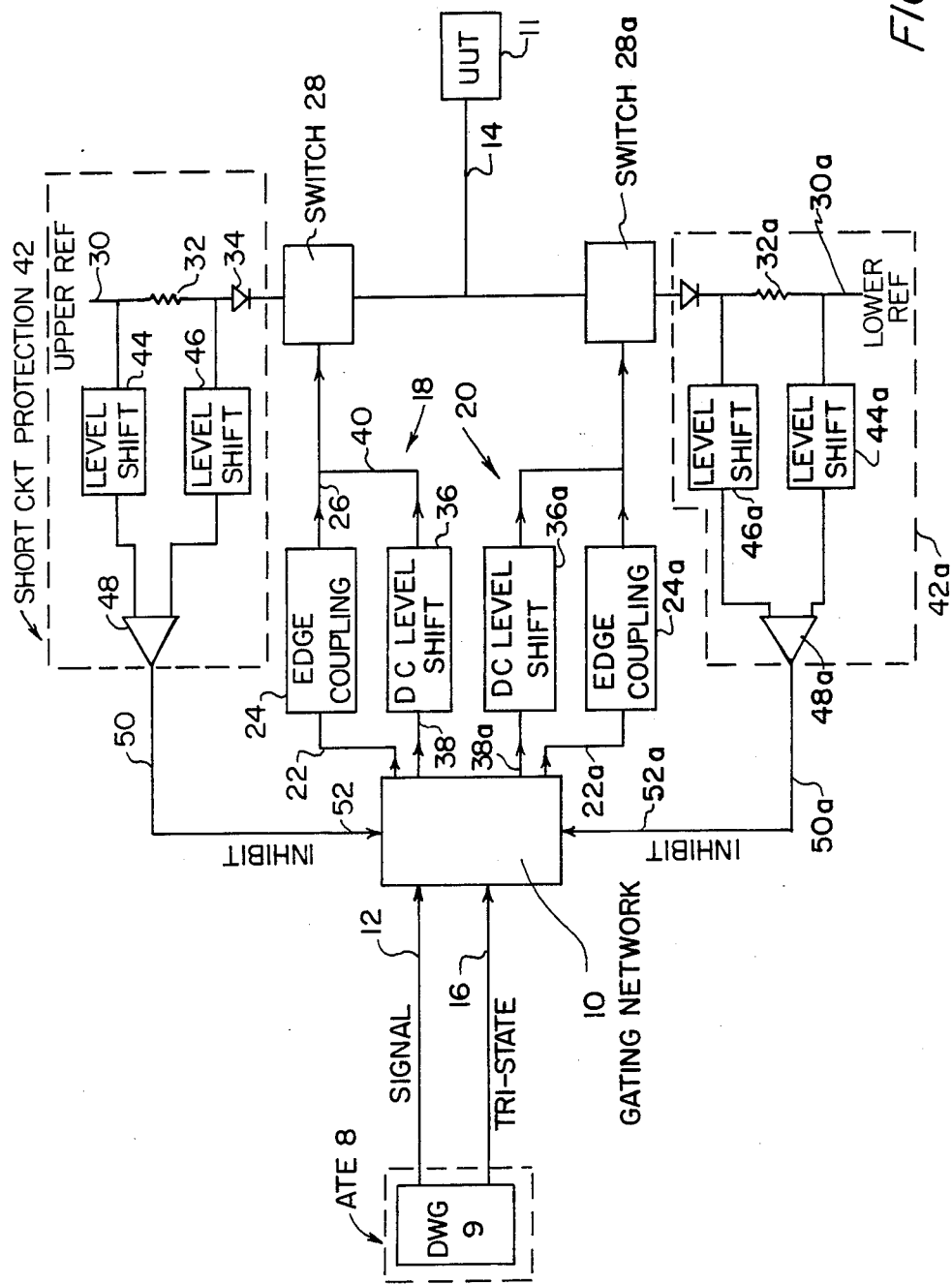
FIG. 1 is a block diagram of the present invention.

FIG. 1 illustrates a basic block diagram of the present invention.

The presence of an automatic test equipment (ATE) is indicated by reference numeral 8. This ATE 8 is conventional; and briefly, it generates logic patterns or data words which are to be transmitted to the input of a unit undergoing test (UUT) 11. Since each type of UUT generally requires different logic patterns to complete a test, the ATE 8 is microprocessor based to generate the necessary logic patterns in the form of digital words, depending upon the particular UUT 11 being tested. Within a conventional ATE 8, a plurality of digital word generators (DWG) 9 is provided to generate digital words in simulation of the logic pattern to be input to the UUT 11. If a parallel output is provided by an ATE 8, a separate DWG 9 must be provided for each of the parallel outputs. Otherwise stated, since the ATE 8 generates a data word comprised of a number of bits, a separate DWG 9 is provided for each bit.

The hybrid circuitry shown connected between the output of DWG 9 and the input 14 of UUT 11 serves to translate the logic levels generated by the DWG 9 and presents such translated levels to the input 14 of UUT 11, as is required by the latter unit in order to complete a test. As previously mentioned, different types of UUT's 11 will require inputs of different binary levels. Thus, the present invention must be capable of generating selectable input levels for the UUT 11. Other than this selectable level change, the driver of the present invention is not intended to change the pulse width or shape of the single bit signal provided at the DWG 9.

With this brief introduction to the invention, further reference is made to FIG. 1 wherein the signal flow through the driver circuit of the invention will now be discussed.

As shown in FIG. 1, front end gating network 10 is provided with a first signal input line 12 which customarily carries signals from DWG 9 at TTL levels. The gating network 10 is discussed in greater detail in connection with FIG. 2. programmable high and low binary levels are provided to the circuit in FIG. 1 so that a level-shifted output signal having more power than the input signal becomes available to the UUT 11 at its input 14. In a typical environment, the output signals may be employed to test different types of UUT's which individually operate with different input signals. By providing a programmable output, different types of UUT's may be accommodated for testing.

A further capability of the circuitry shown in FIG. 1 is the ability of the circuit to accommodate tri-state testing of equipment. In order to accomplish such testing in accordance with known procedures, the UTT input 14 must appear as an open, high impedance output. A tri-state control line 16 is connected to the gating network 10; and when this line is active, the input 14 will maintain a tri-state condition.

In order to generate a programmable upper reference level and a programmable lower reference level, the output of the gating network 10 has similarly configured upper and lower paths, respectively indicated by 18 and 20. For purposes of simplifying the discussion of the present invention, only the upper path 18 will be discussed in detail.

In order to achieve high repetition rates, rising edges of the input signal appearing on line 12 are quickly coupled, via line 22, to the edge coupling circuit 24. The quickly coupled rising edge appears along line 26 and is input to switch 28. When this switch is turned on, the upper reference voltage point 30 becomes connected to the UTT input 14 via load resistor 32, back current protection diode 34 and closed switch 28. Steady state driving of switch 28 follows when the upper level of the TTL input on line 12 is gated, along line 38, to a DC level shifting circuit 36. The output of this circuit is connected to switch 28, via connecting line 40, and provides the driving current to maintain the switch 28 closed for as long as the TTL input signal remains at an upper level. Thus, UTT input 14 will accurately follow the rising transitions and upper levels of the input appearing at 12 but at the level of the upper reference voltage 30. The transitions and steady state levels in connection with the lower signal levels are achieved by identical circuitry indicated in the lower path 20. Identical components in the lower path have been similarly numbered with the addition of a suffix "a." Thus, the switch 28a couples the programmable lower reference voltage point 30a to the UTT input 14.

Each of the circuit paths includes short circuit protection such as the upper path short circuit protection circuit generally indicated by reference numeral 42. The purpose of this circuit is to detect excessive current flowing from the upper reference voltage point 30. In order to avoid this problem, load resistor 32 is used as a current-sensing resistor. Upper and lower terminals of the resistor are respectively connected to level shifters 44 and 46 to preferably downshift the voltage potentials across load resistor 32 to values that will be compatible with the inputs of comparator 48. If excessive current flows through resistor 32, the comparator 48 will generate an inhibit signal along line 50 that is input to the gating network 10. Upon receipt of such an inhibit signal, the gating network 10 becomes disabled and both switches 28 and 28a are opened. This will avoid destruction of sensitive digital circuitry. The comparator has been also configured as a multivibrator. Normally, without the multivibrator action, once an excessive load has been sensed by the comparator, the load will be removed and then reversed. This will cause an oscillation at a natural frequency that could cause excessive heating in the driver and in the UUT. The multivibrator causes a sampling action which waits for a time interval before allowing the load to be applied again. If the excessive load is still present, the multivibrator action will remove it again and so on. This will result in a lower average value of short circuit current. Although the two inhibit lines 52 and 52a are shown as connected to individual inputs of gating network 10, in a preferred embodiment of the invention, both inhibit lines are connected to a single input of the gating network. It should be again emphasized that the occurrence of an inhibit signal along line 50 or 50a will open both switches 28 and 28a. When current sensed by resistor 32 is loaded to an acceptable level, the circuit will operate in a normal manner.

Figure 2:
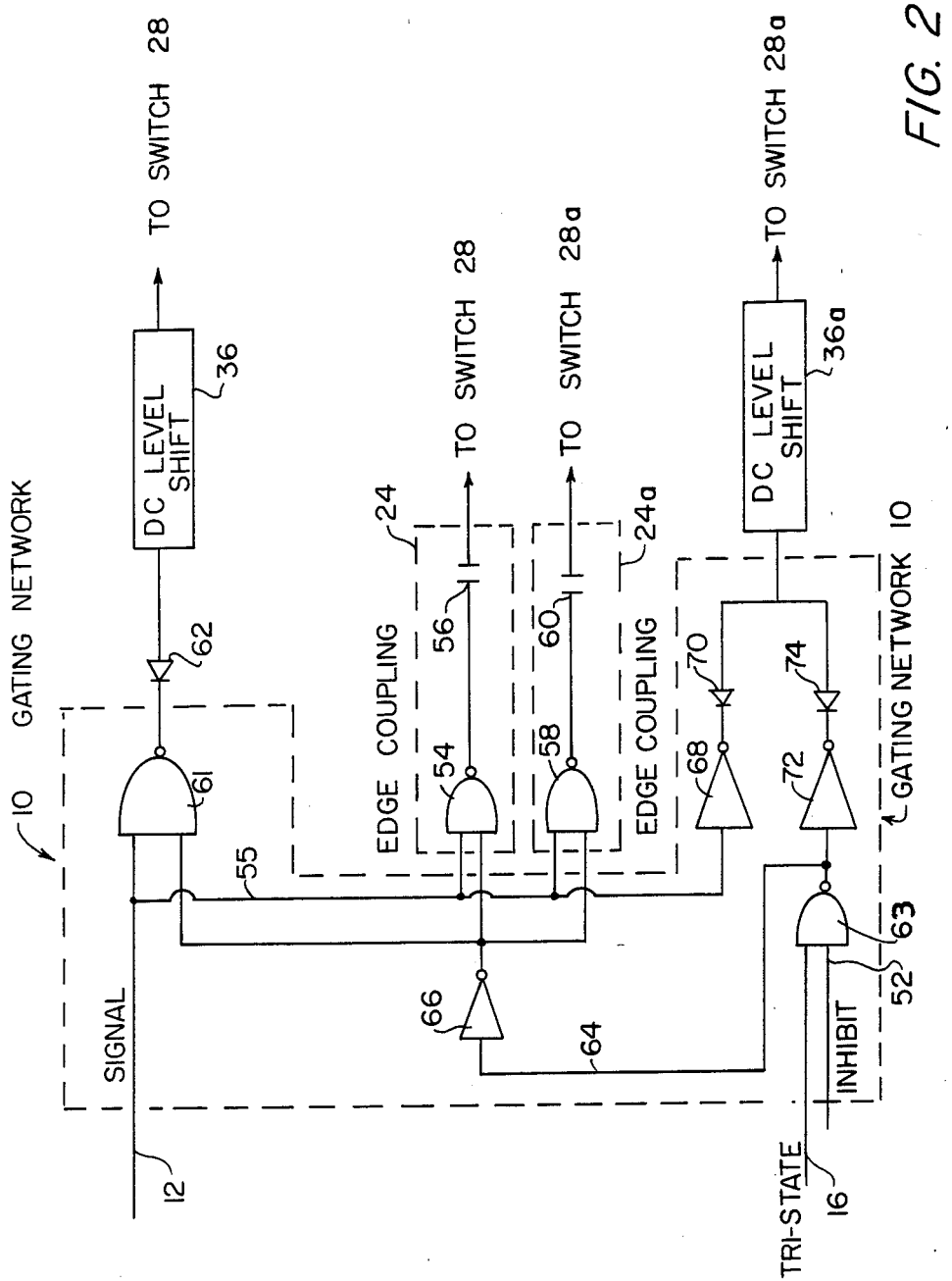
FIG. 2 is a simplified logic diagram of the gating network and edge coupling circuits of the present invention.

FIG. 2 illustrates several of the blocks generally discussed in FIG. 1. The edge coupling circuit 24 includes gate 54 that has its first input connected in parallel with the signal input line 12, via connecting line 55. Serially connected capacitor 56 blocks any DC component of the output from gate 54 and quickly couples the detected signal edge to switch 28. A comparable edge coupling circuit 24a includes gate 58 and capacitor 60, the latter being connected to switch 28a. Immediately after the edge coupling to switches 28 and 28a, the upper or lower level of the input signal will cause a corresponding DC level shifter 36 or 36a to drive a corresponding switch 28 or 28a and allow a respective programmable upper or lower reference voltage to be switched through to the UTT input 14 (FIG. 1). The upper level switch 28 becomes driven when a corresponding upper level of the input signal enables both gate 61 and the DC level shifting circuit 36 connected to the gate output via back current protection diode 62. Negative levels in the input signal cause the DC level shifter 36a to drive switch 28a after the shifting circuit 36a receives the input signal level via inverter 68 and serially connected back current protection diode 70.

In the event that a tri-state condition is desired, a tri-state control signal will appear on line 16 which enables gate 63. The tri-state control signal will then be coupled via inverter 72 and back current protection diode 74 to the low level DC level shifting circuit 36a. The shifting circuit, in response to the tri-state control signal, will open switch 28a. Simultaneously, the enablement of gate 63 couples the tri-state control signal to inverter 66, via connecting line 64; and the output of the inverter 66 serves as a second input to the upper gate 61. When the second input to gate 61 is received, the DC level shifting circuit 36 also goes into operation and opens switch 28. With switches 28 and 28a open, the UTT input 14 will appear in a tri-state condition which is necessary when certain electronic equipment is connected to the UTT input 14 and is to be tested in a tri-state mode.

As previously explained, the sensing of excessive current by resistor 32 or 32a will result in an inhibit signal to the gating network 10. More particularly, the inhibit line 52 or 52a will in actuality exist as a single inhibit input line 52 as shown in FIG. 2. This will enable gate 63 as did a tri-state control signal and the result will likewise be the switching off of switches 28 and 28a until the excessive or short circuit detected condition is corrected.

By virtue of the described invention, an accurate high speed interface is achievable between a TTL input signal and an electronic digital circuit requiring higher translated binary levels for operation. The interface unit of the present invention effectively provides programmable high and low levels at its output thereby enabling a wide variety of digital equipment, connected at its output, to be accommodated.

It should be understood that the invention is not limited to the exact details of construction shown and described herein for obvious modifications will occur to persons skilled in the art.

I claim:

1. A digital driver for variably translating low level input signals from an automatic test equipment to programmable levels acceptable to a unit undergoing test, the driver having two parallel paths, each of which comprises:

means for coupling the rising edge of the input signal to switching means for quickly turning on the switching means;

means for shifting the low voltage level input by a fixed amount for driving the switching means after the rising edge of an input signal is coupled thereto;

a variable reference voltage point;

the switching means connected at a control terminal to the output of the level shifting means and the edge coupling means for switching in synchronism with the input signal;

means connecting the reference voltage point to the switching means for generating a signal with a translated voltage level at the output of the switching means;

means connecting the output of the switching means to the input of a unit undergoing test;

wherein the outputs of the switching means for the two parallel paths are connected together for providing a binary signal in synchronism with the input signal and having voltage levels dependent upon respective high and low reference voltages;

gating means connected at its output to the input of each level shifting means, the input signal provided at the input of the gating means for passage to the parallel paths;

the gating means having a tri-state control input for opening the gating means and producing a high output impedance at the switching means output regardless of the input signal.

2. A digital driver for variably translating low level input signals from an automatic test equipment to programmable levels acceptable to a unit undergoing test, the driver having two parallel paths, each of which comprises:

means for coupling the rising edge of the input signal to switching means for quickly turning on the switching means;

means for shifting the low voltage level input by a fixed amount for driving the switching means after the rising edge of an input signal is coupled thereto;

a variable reference voltage point;

the switching means connected at a control terminal to the output of the level shifting means and the edge coupling means for switching in synchronism with the input signal;

means connecting the reference voltage point to the switching means for generating a signal with a translated voltage level at the output of the switching means;

means connecting the output of the switching means to the input of a unit undergoing test;

wherein the outputs of the switching means for the two parallel paths are connected together for providing a binary signal in synchronism with the input signal and having voltage levels dependent upon respective high and low reference voltages;

gating means connected at its output to the input of each level shifting means, the input signal provided at the input of the gating means for passage to the parallel paths;

the gating means having a tri-state control input for opening the gating means and producing a high output impedance at the switching means output regardless of the input signal;

means associated with each path and connected to the means connecting the reference voltage point to the switching means for detecting an excessive current condition, the output of the detecting means connected to the gating means for opening both paths until the excessive current condition no longer exists.

* * * * *

UNITED STATES PATENT AND TRADEMARK OFFICE
CERTIFICATE OF CORRECTION

PATENT NO. : 4,791,312

DATED : December 13, 1988

INVENTOR(S) : John M. Weick

It is certified that error appears in the above-identified patent and that said Letters Patent is hereby corrected as shown below:

```
Column 2, line 50, change "programmable" to --Programmable--.

Column 2, line 62, change "UTT" to --UUT--.

Column 3, line 12, change "UTT" to --UUT--.

Column 3, line 20, change "UTT" to --UUT--.

Column 3, line 29, change "UTT" to --UUT--.

Column 4, line 13, change "UTT" to --UUT--.

Column 4, line 35, change "UTT" to --UUT--.

Column 4, line 37, change "UTT" to --UUT--.
```

Signed and Sealed this

Twenty-fifth Day of April, 1989

Attest:

DONALD J. QUIGG

*Attesting Officer*  *Commissioner of Patents and Trademarks*